(12) United States Patent
Kim

(10) Patent No.: US 12,075,570 B2
(45) Date of Patent: Aug. 27, 2024

(54) ELECTRONIC DEVICE INCLUDING BATTERY COVER FASTENING STRUCTURE

(71) Applicant: Samsung Electronics Co., Ltd., Gyeonggi-do (KR)

(72) Inventor: Kiwon Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 273 days.

(21) Appl. No.: 17/828,206

(22) Filed: May 31, 2022

(65) Prior Publication Data

US 2023/0013128 A1    Jan. 19, 2023

Related U.S. Application Data

(63) Continuation of application No. PCT/KR2022/006851, filed on May 13, 2022.

(30) Foreign Application Priority Data

Jul. 14, 2021    (KR) .................. 10-2021-0092496

(51) Int. Cl.
*H01M 50/247* (2021.01)
*H05K 5/00* (2006.01)

(52) U.S. Cl.
CPC ......... *H05K 5/0013* (2013.01); *H05K 5/0086* (2013.01); *B65D 2585/88* (2013.01)

(58) Field of Classification Search
CPC ............ H01M 50/216; H01M 50/247; H01M 50/262; H01M 2220/30; H05K 5/0013;

(Continued)

(56) References Cited

U.S. PATENT DOCUMENTS 8,315,051 B2    11/2012 Kim et al.
8,329,329 B2 *  12/2012 Wang ................. H01M 50/202
                                                          429/96

(Continued)

FOREIGN PATENT DOCUMENTS

KR    10-2010-0037852 A    4/2010
KR    10-2012-0035705 A    4/2012

(Continued)

OTHER PUBLICATIONS

International Search Report dated Aug. 17, 2022.

*Primary Examiner* — Luan K Bui
(74) *Attorney, Agent, or Firm* — Cha & Reiter, LLC

(57) ABSTRACT

An electronic device may include the first housing facing the first direction, the second housing fastened to the first housing to face the second direction opposite to the first direction and including the battery disposition space open toward the second direction and the plurality of first insert portions that are apart from each other on the periphery of the battery disposition space along a circumference of the battery disposition space, and the cover fastened to the second housing to cover the battery disposition space, the cover including the first cover including the first material and the second cover including the second material and coupled to the first cover from the second direction, wherein the first cover may include the plurality of first hook structures provided at locations corresponding to the plurality of first insert portions and configured to fasten the second housing to the cover by being inserted into the plurality of first insert portions.

20 Claims, 10 Drawing Sheets

(58) Field of Classification Search
CPC ......... H05K 5/0086; Y02E 60/10; G06F 1/16;
G06F 1/1628; G06F 1/1635; B65D
2585/88
USPC ........... 429/96, 100; 174/135; 206/320, 703,
206/704
See application file for complete search history.

(56) References Cited

U.S. PATENT DOCUMENTS

| | | | |
|---|---|---|---|
| 8,691,420 B2 | 4/2014 | Yoo | |
| 8,748,024 B2* | 6/2014 | Wyser | H01M 50/24 |
| | | | 429/96 |
| 9,176,527 B2 | 11/2015 | Lee et al. | |
| 9,246,144 B2 | 1/2016 | Cho | |
| 9,338,264 B2 | 5/2016 | Shinoda et al. | |
| 9,507,382 B2 | 11/2016 | Lee et al. | |
| 2005/0287423 A1* | 12/2005 | Yeh | H01M 50/216 |
| | | | 429/97 |
| 2006/0115715 A1* | 6/2006 | Ge | H01M 50/591 |
| | | | 429/97 |
| 2010/0279163 A1 | 11/2010 | Lao | |
| 2012/0009454 A1* | 1/2012 | Hirano | H01M 50/216 |
| | | | 429/100 |
| 2012/0295146 A1* | 11/2012 | Song | H01M 50/216 |
| | | | 429/100 |
| 2023/0018206 A1* | 1/2023 | Peng | H01M 50/216 |
| 2023/0090299 A1* | 3/2023 | Neuharth | H01M 50/247 |
| | | | 429/96 |

FOREIGN PATENT DOCUMENTS

| | | |
|---|---|---|
| KR | 10-2013-0135647 A | 12/2013 |
| KR | 10-2019-0051125 A | 5/2019 |
| KR | 10-2192148 B1 | 12/2020 |

* cited by examiner

ELECTRONIC DEVICE INCLUDING BATTERY COVER FASTENING STRUCTURE

CROSS-REFERENCE TO RELATED APPLICATIONS

This application is a continuation of International Application No. PCT/KR2022/006851 designating the United States, filed on May 13, 2022, in the Korean Intellectual Property Receiving Office and claiming priority to Korean Patent Application No. 10-2021-0092496, filed on Jul. 14, 2021, in the Korean Intellectual Property Office, the disclosures of which are incorporated by reference herein in their entireties.

BACKGROUND

1. Technical Field

The disclosure relates to an electronic device including a battery cover fastening structure.

2. Description of Related Art

An electronic device receiving power from a battery may include a housing defining a space for battery disposition (i.e., a space is which a battery is placed), and a battery cover that covers the space in which a battery is received or placed. In addition, the battery cover may be detachably provided on the housing for battery replacement. For example, the battery cover and the housing may be detachably fastened to each other through a screw fastening structure, a rib fastening structure, a rotation locking structure, or a hook fastening structure.

SUMMARY

When a battery cover and a housing are fastened to each other through a screw or a rib, the size of an electronic device may be larger than devices that do not include components or structures, such as the screw or the rib. When the battery cover and the housing are fastened to each other through a rotation lock structure, aesthetics may be deteriorated as a part is divided, and a separate tool for rotating the battery cover may be required. When the battery cover and the housing are fastened to each other through a hook fastening structure, the fastening force may be of a strength that necessitates that us of a separate tool to release the fastening. In that case a product exterior may be damaged when releasing the fastening. In a case where the fastening force is too weak, the battery cover may be unintentionally separated from the housing by external impact.

According to certain embodiments, by additionally providing a hook near a battery disposition space, the fastening force between the housing and the battery cover may be improved and the battery cover may be inhibited from being separated from the housing due to the external impact.

According to certain embodiments, when a user desires to remove the battery cover, the user may easily remove the battery cover through a double injection structure of the battery cover, and while in a typical use state, stability may be secured by maintaining the fastening force of the battery cover.

According to certain embodiments, the battery may be protected from the external impact and contact between the battery and a terminal may be stably maintained.

According to certain embodiments, the electronic device 200 may include the first housing 211 facing the first direction; the second housing 212 fastened to the first housing 211 to face the second direction opposite to the first direction and including the battery disposition space 2121 open toward the second direction and the plurality of first insert portions 2122 in the periphery of the battery disposition space while being spaced apart from each other along the circumference of the battery disposition space 2121; and the cover 240 fastened to the second housing 212 to cover the battery disposition space 2121, and the cover 240 may include the first cover 241 formed of the first material; and the second cover 242 formed of the second material and coupled to the first cover 241 from the second direction, and the first cover 241 may include the plurality of first hook structures 2411 provided at the location corresponding to the plurality of first insert portions 2122 and configured to fasten the second housing 212 to the cover 240 by being inserted into the plurality of first insert portions 2122.

According to certain embodiments, the electronic device 200 may include the housing 210 including the battery disposition space 2121 open toward the rear side and the plurality first insert portions 2122 on the periphery of the battery disposition space 2121 while being spaced apart from each other along the circumference of the battery disposition space 2121; and the cover 240 fastened to the rear side of housing 210 to cover the battery disposition space 2121, and the cover 240 may include the first cover 241 formed of the first material; and the second cover 242 formed of the second material and coupled to the rear side of the first cover 241, and the first cover 241 may include the plurality of first hook structures 2411 provided at the location corresponding to the plurality of first insert portions 2122 and configured to fasten the housing 210 to the cover 240 by being inserted into the plurality of first insert portions 2122.

According to certain embodiments, the electronic device 200 may include the first housing 211 facing the first direction; the second housing 212 fastened to the first housing 211 to face the second direction opposite to the first direction and including the battery disposition space 2121 open toward the second direction; and the cover 240 fastened to the second housing 212 to cover the battery disposition space 2121, and the second housing 2121 may further include the plurality of first insert portions 2122 on the periphery of the battery disposition space 2121 while being spaced apart from each other along the circumference of the battery disposition space 2121; and the plurality of second insert portions 2123 on the outer part of the second housing 212 while being spaced apart from each other along the circumference of the second housing 212, and the cover 240 may include the first cover 241 formed of the first material; and the second cover 242 formed of the second material that has a lesser hardness than the first material, and coupled to the first cover 241 from the second direction, the first cover 241 may include the plurality of first hook structures 2411 provided at the location corresponding to the plurality of first insert portions 2122 and configured to fasten the second housing 212 to the cover 240 by being inserted into the plurality of first insert portions 2122; and the plurality of second hooks 2412 provided at the location corresponding to the plurality of second insert portions 2123, and configured to fasten the second housing 212 to the cover 240 by being inserted into the plurality of second insert portions 2123, and the first hook structure 2411 may include a cantilever 24111 including the free end 24111b at one side and the fixed end 24111a at another side; the cutout 24112 cutting out a portion of the first cover 241 to provide the cantilever 24111; and the first hook 24113 protruding from the cantilever 24111 toward the first direction, and in case the free end 24111*b* of the cantilever 24111 is pressed toward the first direction, fastening between the first hook 24113 and the first insert portion 2122 may be released as the cantilever 24111 is bent to protrude toward the first direction based on the fixed end 24111*a*.

According to certain embodiments, the fastening force between the housing and the battery cover may be improved.

According to certain embodiments, the battery cover may be prevented from being separated from the housing due to external impact.

According to certain embodiments, when the user desires to remove the battery cover, the user may easily remove the battery cover through a double injection structure.

According to certain embodiments, in a typical use state, stability may be secured by maintaining the fastening force of the battery cover.

According to certain embodiments, the battery may be protected from the external impact and contact between the battery and a terminal may be stably maintained.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
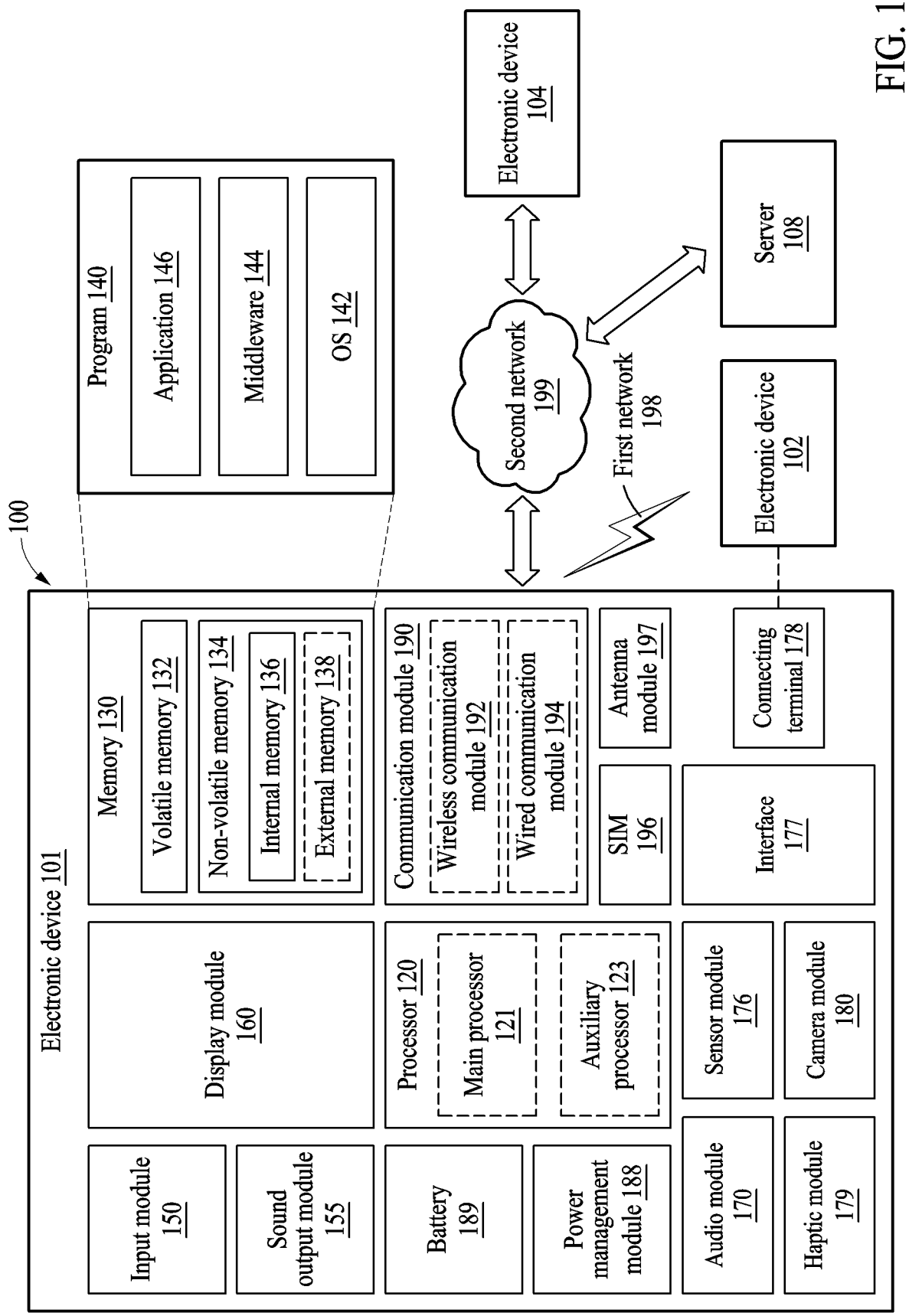
FIG. 1 is a block diagram of an electronic device in a network environment according to a certain embodiments.

Hereinafter, example embodiments will be described in detail with reference to the accompanying drawings. When describing the example embodiments with reference to the accompanying drawings, like reference numerals refer to like elements and a repeated description related thereto will be omitted.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input module 150 or output the sound via the sound output device 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to certain embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that certain embodiments of the present disclosure and the terms used therein are not intended to limit the technological features set forth herein to any particular embodiment and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Certain embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2A:
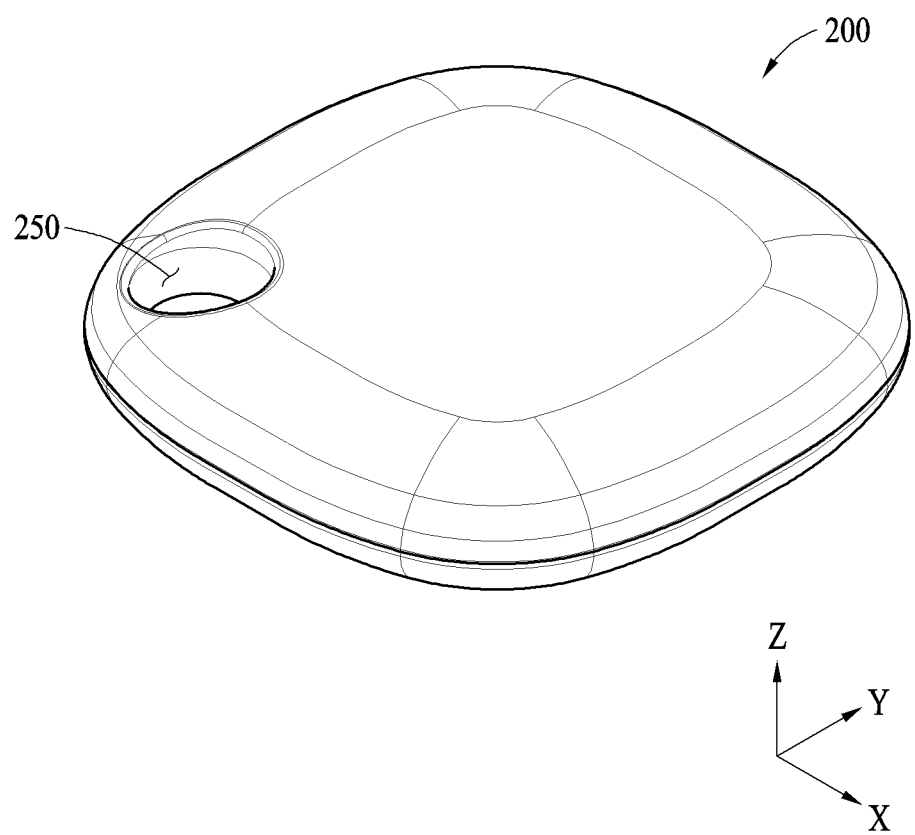
FIG. 2A is a perspective view of an electronic device according to an example embodiment.
Figure 2B:
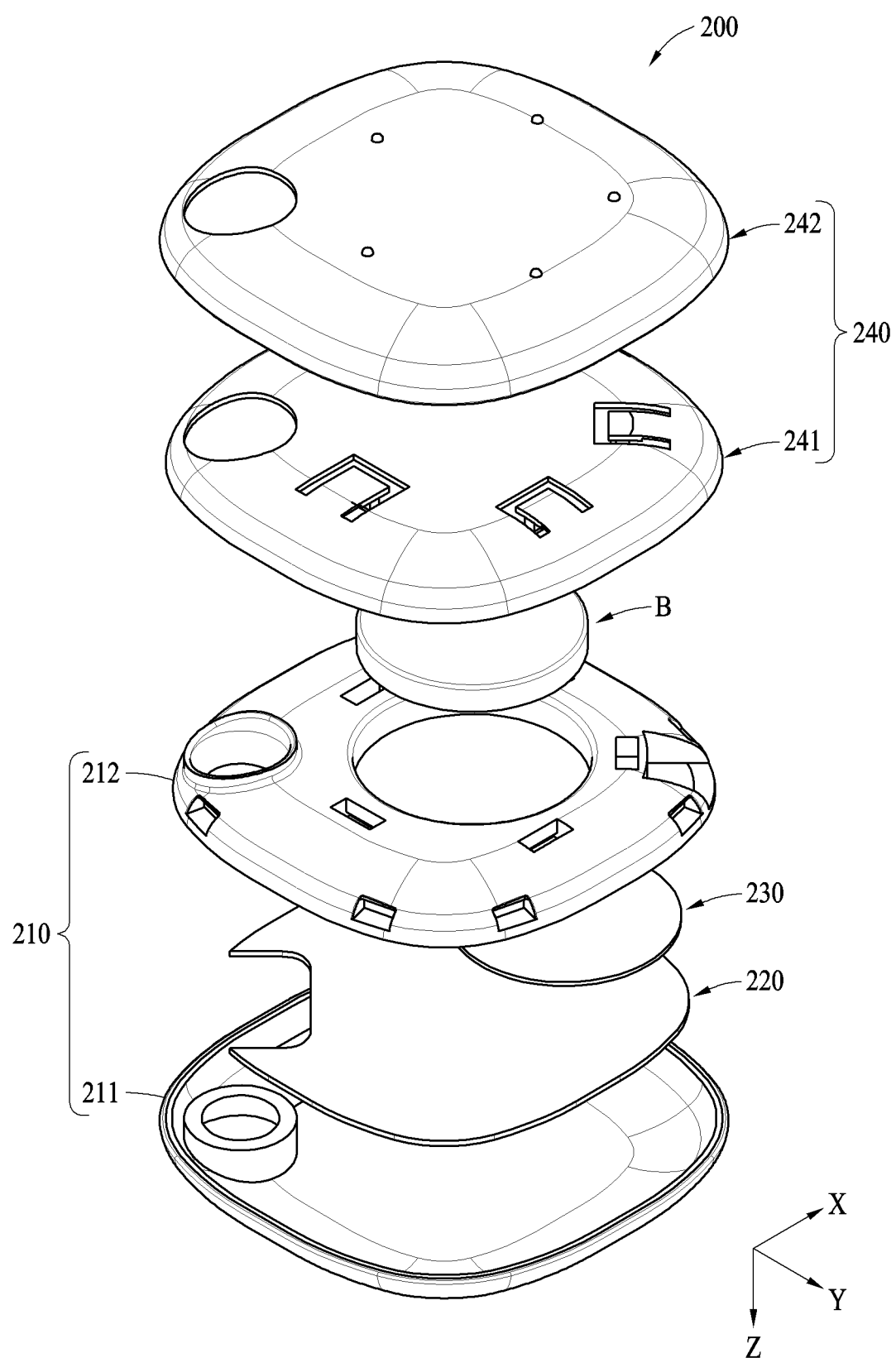
FIG. 2B is an exploded perspective view of the electronic device according to an example embodiment.
Figure 2C:
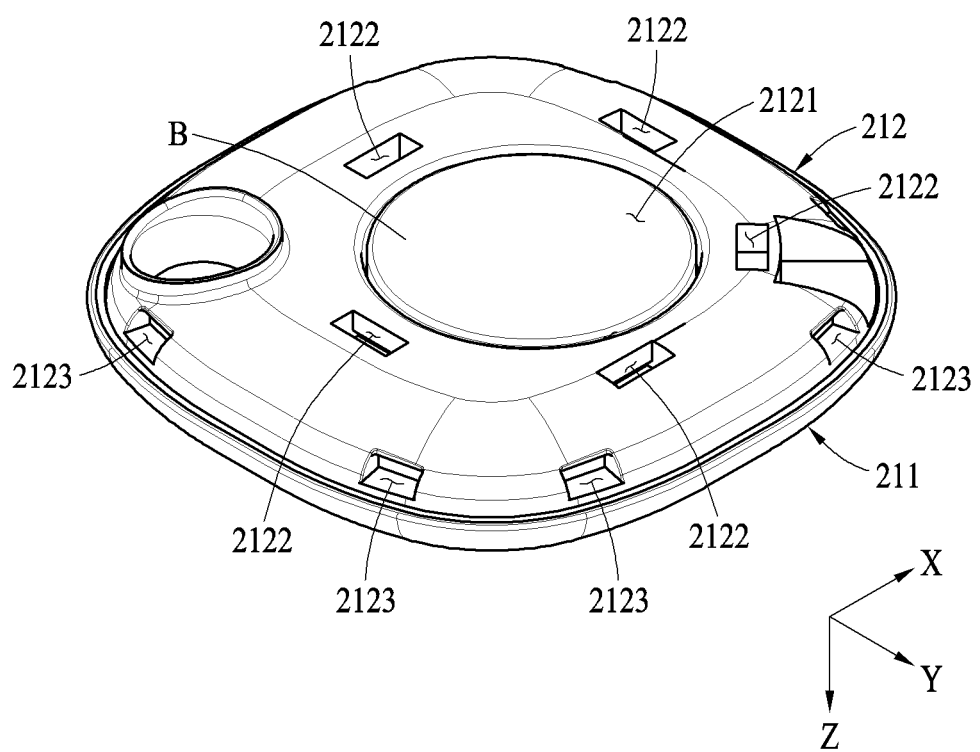
FIG. 2C is a perspective view of the electronic device when a cover is separated from the electronic device according to an example embodiment.

FIG. 2A is a perspective view of an electronic device according to an example embodiment. FIG. 2B is an exploded perspective view of the electronic device according to an example embodiment. FIG. 2C is a perspective view of the electronic device when a cover is separated from the electronic device according to an example embodiment.

Referring to FIGS. 2A to 2C, an electronic device 200 (e.g., the electronic device 101 of FIG. 1) may be a device for tracking a location of a target object. For example, the electronic device 200 may be attached to the target object (e.g., an object or an animal), and may inform a location of the target object to a user. The electronic device 200 may communicate with another electronic device (e.g., the electronic device 102 or the electronic device 104 of FIG. 1). For example, the other electronic device, that is, the electronic device 102 or 104, may be a smartphone, a personal computer (PC), a smart watch, and/or a tablet. However, this is an example, and the other electronic device, that is, the electronic device 102 or 104, which may communicate with the electronic device 200, is not limited thereto. The electronic device 200 may provide information on the location of the target object to the other electronic device, that is, the electronic device 102 or 104, and the user may identify the location of the target object through the other electronic device, that is, the electronic device 102 or 104. The electronic device 200 may allow the user to recognize the location of the target object by generating sound. However, this is an example, and a type of the electronic device 200 is not limited thereto.

In an example embodiment, the electronic device 200 may include a housing 210, a printed circuit board 220, a sound generator 230, a cover 240, and a penetrating hole 250.

In an example embodiment, the housing 210 may form an exterior of the electronic device 200. The housing 210 may form a space to dispose a component (e.g., the printed circuit board 220 and/or the sound generator 230) therein. The housing 210 may include a first housing 211 and a second housing 212. The first housing 211 may form a front side (e.g., a +z axis direction) of an external figure of the electronic device 200, and the second housing 212 may form a rear side (e.g., a −z axis direction) of the external figure of the electronic device 200. The first housing 211 may be disposed to face a front surface direction (e.g., the +z axis direction). The second housing 212 may be disposed to face a direction opposite to the first housing 211. For example, the second housing 212 may be disposed to face a rear surface direction (e.g., the −z axis direction). The first housing 211 and the second housing 212 may be provided in a shape substantially corresponding to each other. The first housing 211 and the second housing 212 may be fastened to each other to form a space for disposing a component therein. FIGS. 2A to 2C illustrate that corners of the first housing 211 and the second housing 212 are provided in a round rectangular shape, however, this is an example, and the shapes of the first housing 211 and the second housing 212 are not limited thereto.

In an example embodiment, the second housing 212 may include a battery disposition space 2121, a first insert portion 2122, and a second insert portion 2123.

In an example embodiment, the battery disposition space 2121 may be provided in a rear side (e.g., the −z axis direction) of the second housing 212. The battery disposition space 2121 may be formed open toward the rear side (e.g., the −z axis direction). A battery B may be inserted into and disposed on the battery disposition space 2121. The battery disposition space 2121 may be provided in a shape substantially corresponding to the applied battery B. For example, the battery B may be a coin-shaped battery B. However, this is an example, and the applied type and/or shape of the battery B is not limited thereto.

In an example embodiment, the first insert portion 2122 may be a space in which a first hook (e.g., a first hook 24113 of FIG. 2G), which is described later, inserts. The first insert portion 2122 may be a structure to be fastened to at least a portion of a first hook structure 2411. The first insert portion 2122 may be provided in a shape to be fastened to the first hook 24113. For example, the first insert portion 2122 may be provided in a corresponding hook shape (e.g., a hook shape 2122a of FIG. 2I) to be fastened to the first hook 24113. As the first hook 24113 is inserted into the first insert portion 2122, the first insert portion 2122 and the first hook 24113 may be fastened to each other. A plurality of first insert portions 2122 may be provided. The plurality of first insert portions 2122 may be provided apart from each other in a periphery of the battery disposition space 2121 along a circumference of the battery disposition space 2121. The periphery of the battery disposition space 2121 may be a region adjacent to the circumference of the battery disposition space 2121. For example, the periphery of the battery disposition space 2121 may be a region closer to the circumference of the battery disposition space 2121 than a circumference of the second housing 212. For example, as shown in FIG. 2C, five of the first insert portions 2122 may be disposed apart from each other in the periphery of the battery disposition space 2121 along the circumference of the battery disposition space 2121. However, this is an example, and the number and/or the location of the first insert portions 2122 are not limited thereto.

In an example embodiment, the second insert portion 2123 may be a space in which a second hook (e.g., a second hook 2412 of FIG. 2D), which is described later, inserts. The second insert portion 2123 may be provided in a shape to be fastened to the second hook 2412. For example, the second insert portion 2123 may be provided in a corresponding hook shape to be fastened to the second hook 2412. As the second hook 2412 inserts into the second insert portion 2123, the second insert portion 2123 and the second hook 2412 may be fastened to each other. A plurality of second insert portions 2123 may be provided. The plurality of second insert portions 2123 may be provided apart from each other in an outer part of the second housing 212 along the circumference of the second housing 212. The outer part of the second housing 212 may be a region adjacent to the circumference of the second housing 212. For example, the outer part of the second housing 212 may be a region closer to the circumference of the second housing 212 than the circumference of the battery disposition space 2121. The second insert portion 2123 may be provided on an outer side, compared to the first insert portion 2122, based on the center of the second housing 212. For example, eight of the second insert portions 2123 may be disposed apart from each other on the outer part of the second housing 212 along the circumference of the second housing 212. However, this is an example, and the number and/or the location of the second insert portions 2123 are not limited thereto.

In an example embodiment, components for operating the electronic device 200 may be mounted on the printed circuit board 220. For example, a processor, a memory, a communication module, a location tracking module, and/or an interface may be mounted on the printed circuit board 220. However, this is an example, and a component mounted on the printed circuit board 220 is not limited thereto.

In an example embodiment, the sound generator 230 (e.g., the sound output module 155 of FIG. 1) may output sound to the outside of the electronic device 200. The sound generator 230 may be connected to the printed circuit board 220. For example, the sound generator 230 may include a speaker and/or a buzzer.

In an example embodiment, the cover 240 may be fastened to a rear side (e.g., the −z axis direction) of the second housing 212 to cover the battery disposition space 2121. The cover 240 may be detachably fastened to the second housing 212. The cover 240 may be detachably fastened to the second housing 212 through a first hook structure (e.g., the first hook structure 2411 of FIG. 2D) and the second hook 2412, described below. For example, the cover 240 and the second housing 212 may be fastened to each other by inserting the first hook 24113 and the second hook 2412 into the first insert portion 2122 and the second insert portion 2123, respectively. In addition, fastening between the cover 240 and the second housing 212 may be released by separating the first hook 24113 and the second hook 2412 from the first insert portion 2122 and the second insert portion 2123, respectively. The cover 240 may be provided in a shape substantially corresponding to the second housing 212. However, this is an example, and the shape of the cover 240 is not limited thereto.

In an example embodiment, the cover 240 may include a first cover 241 and a second cover 242.

In an example embodiment, the first cover 241 may be configured to be directly fastened to the second housing 212. The second cover 242 may be coupled to the first cover 241 from a rear side (e.g., the −z axis direction). The second cover 242 may be configured to substantially form a rear (e.g., the −z axis direction) exterior of the electronic device 200. The first cover 241 and the second cover 242 may be provided in a shape substantially corresponding to each other.

In an example embodiment, a penetrating hole 250 may be provided to penetrate one side of the electronic device 200. For example, the penetrating hole 250 may be provided to penetrate a part near a corner of the electronic device 200. The penetrating hole 250 may be a hole through which a fastening member (e.g. a ring) for connecting the electronic device 200 to a target object passes. The penetrating hole 250 may be provided passing through at least the first housing 211, the second housing 212, and the cover 240. However, the penetrating hole 250 illustrated in FIG. 2A is an example, and the location, the size, and/or the shape of the penetrating hole 250 are not limited thereto.

Figure 2D:
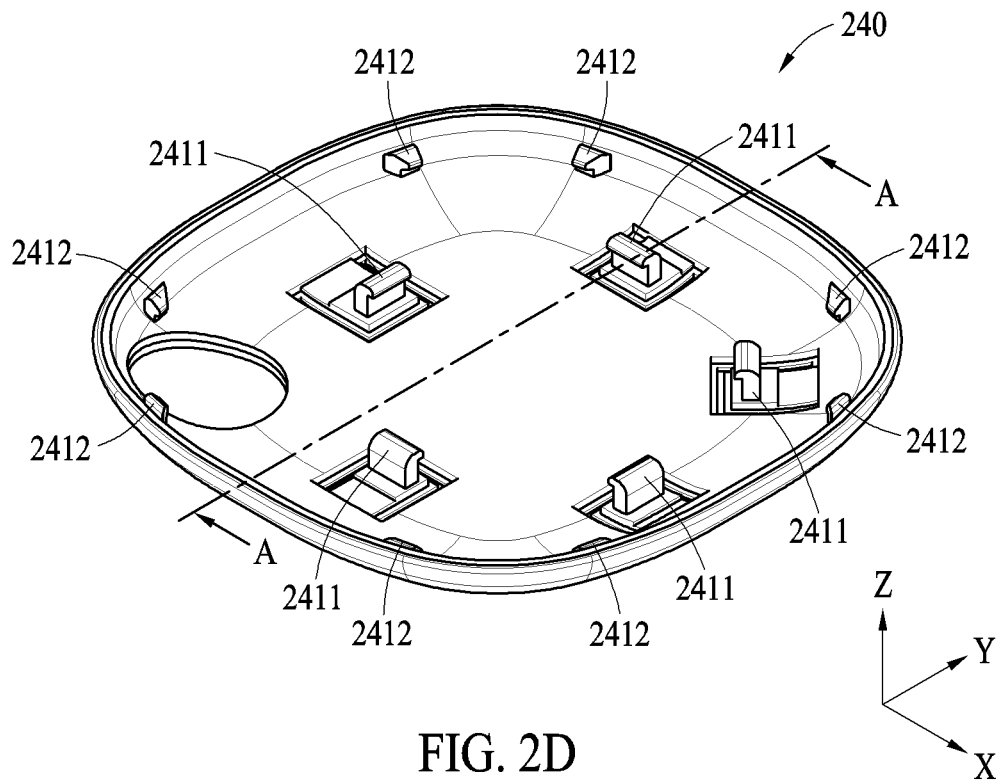
FIG. 2D is a perspective view of a cover according to an example embodiment.
Figure 2E:
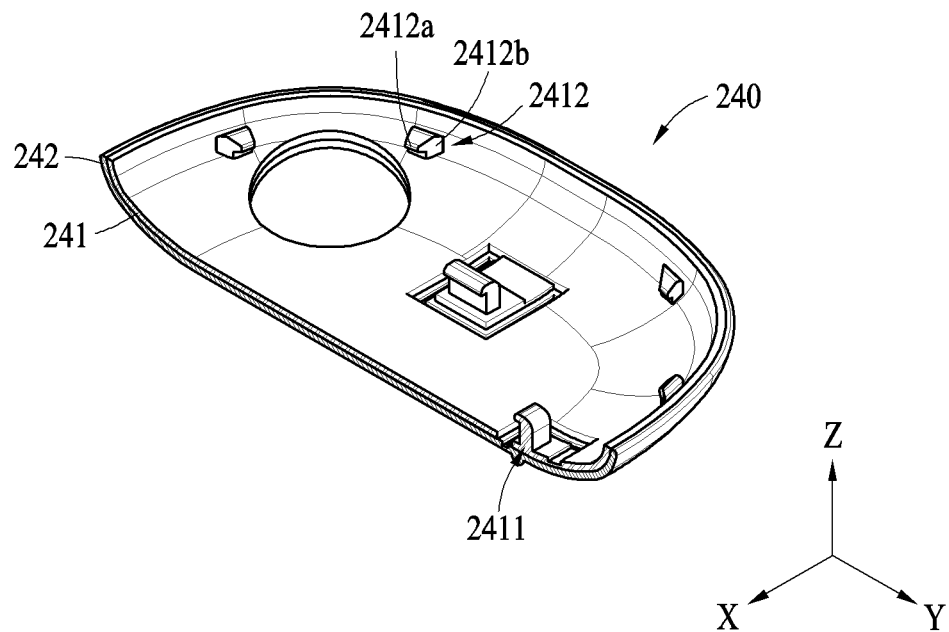
FIG. 2E is a cross-sectional perspective view taken along line A-A of FIG. 2D.

FIG. 2D is a perspective view of a cover according to an example embodiment. FIG. 2E is a cross-sectional perspective view taken along line A-A of FIG. 2D.

Referring to FIGS. 2D and 2E, the first cover 241 may be formed of a first material and the second cover 242 may be formed of a second material. The second material may be different from the first material. For example, the second material may have a lesser hardness than the first material. For example, the second material may have a greater elasticity than the first material. For example, the second material may have a high elasticity and a high restoring force. For example, the second material may include urethane and/or rubber. For example, the first material may include polycarbonate (PC). However, this is an example, and types of the first material and the second material are not limited thereto.

In an example embodiment, the first cover 241 and the second cover 242 may be integrally formed through a double injection process. For example, the cover 240 may be provided in a shape in which the second cover 242 covers a rear surface (e.g., the −z axis direction surface) of the first cover 241, and may be integrally formed through a double injection process. According to the configuration described above, the cover 240 may be seamlessly formed. However, this is an example, and the first cover 241 and the second cover 242 may be provided as separate parts and may be fastened to each other through a fastening structure.

In an example embodiment, the first cover 241 may include the first hook structure 2411 and the second hook 2412.

In an example embodiment, the first hook structure 2411 may be configured to be fastened to the first insert portion 2122 by inserting at least a portion of the first hook structure 2411 into a first insert portion (e.g., the first insert portion 2122 of FIG. 2C) of a second housing (e.g., the second housing 212 of FIG. 2C). A plurality of first hook structures 2411 may be provided. The number of first hook structures 2411 may correspond to the number of first insert portions 2122. The first hook structure 2411 may be provided at a location substantially corresponding to the first insert portion 2122. Based on a state in which the cover 240 is fastened to the second housing 212, the plurality of first hook structures 2411 may be provided apart from each other on the periphery of the battery disposition space (e.g., the battery disposition space 2121 of FIG. 2C) along the circumference of the battery disposition space 2121. For example, as shown in FIG. 2D, five of the first hook structures 2411 may be provided at locations corresponding to five of the first insert portions 2122 shown in FIG. 2C, respectively. However, this is an example, and the number and/or the location of the first hook structures 2411 are not limited thereto.

In an example embodiment, the second hook 2412 may be configured to be fastened to a second insert portion (e.g. the second insert portion 2123 of FIG. 2C) by inserting at least a portion of the second hook 2412 into the second insert portion 2123 of a second housing (e.g. the second housing 212 of FIG. 2C). A plurality of second hooks 2412 may be provided. The number of second hooks 2412 may correspond to the number of second insert portions 2123. The second hook 2412 may be provided at a location substantially corresponding to the second insert portion 2123. Based on a state in which the cover 240 is fastened to the second housing 212, the plurality of second hooks 2412 may be provided apart from each other on an outer part of the second housing 212 along the circumference of the second housing 212. The second hooks 2412 may be provided apart from each other on an outer part of the first cover 241 along the circumference of the first cover 241. For example, as shown in FIG. 2D, eight of the second hooks 2412 may be provided at locations corresponding to eight of the second insert portions 2123, respectively. However, this is an example, and the number and/or the location of the second hooks 2412 are not limited thereto.

In an example embodiment, the second hook 2412 may protrude from a front surface (e.g., the +z axis direction surface) of the first cover 241 toward a front direction (e.g., the +z axis direction). A head 2412a of the second hook 2412 may be substantially provided in a direction toward the center of the first cover 241. A side surface 2412b of the second hook 2412 may be inclinedly formed. For example, the side surface 2412b of the second hook 2412 may be inclinedly formed in a direction in which an outer width of the second hook 2412 is greater than an inner width of the second hook 2412. For example, a cross-section of the second hook 2412 with respect to an x-y plane may be formed in a trapezoidal shape of which a length of an outer side is greater than a length of an inner side. In case the side surface 2412b of the second hook 2412 is inclinedly formed, fastening between the second hook 2412 and the second insert portion 2123 may be easily released. For example, when constant force is applied to the first cover 241, the second hook 2412 may be separated from the second insert portion 2123.

In an example embodiment, at least a portion of the plurality of first hook structures 2411 and at least a portion of the plurality of second hooks 2412 may be alternately disposed in a circumferential direction of the first cover 241, based on the center of the first cover 241. For example, in the circumferential direction of the first cover 241, the second hook 2412 may be disposed between two adjacent first hook structures 2411. For example, in the circumferential direction of the first cover 241, the first hook structure 2411 may be disposed between two adjacent second hooks 2412. According to the disposition described above, fastening force may be evenly distributed in the circumferential direction of the cover 240. However, this is an example, and the disposition of the plurality of first hook structures 2411 and the plurality of second hooks 2412 is not limited thereto. For example, as shown in FIG. 2D, the first hook structure 2411 may not be provided between some of two adjacent second hooks 2412.

Figure 2F:
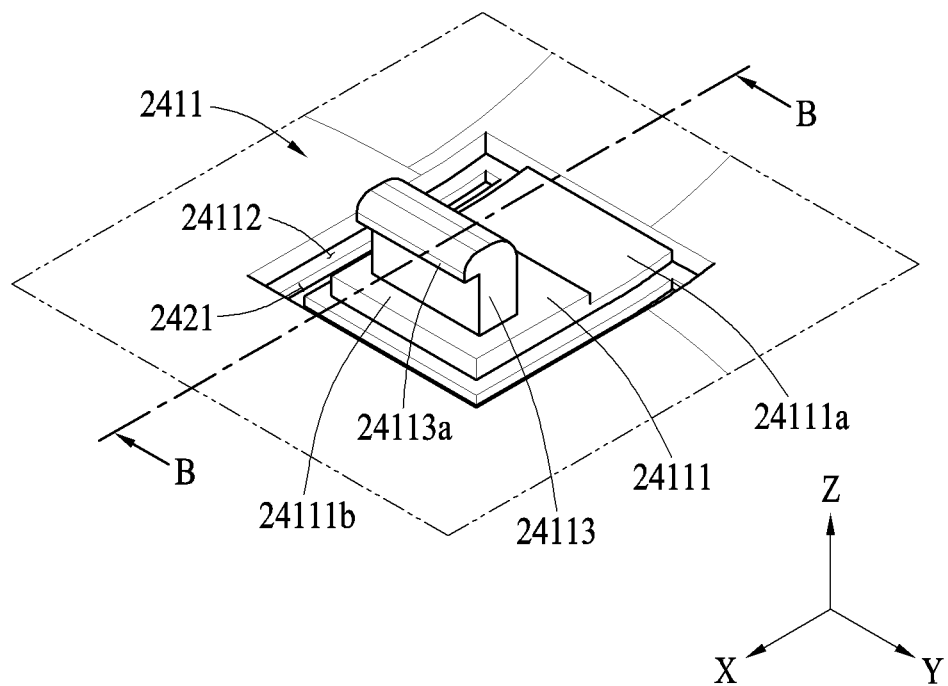
FIG. 2F is a perspective view of a first hook structure according to an example embodiment.
Figure 2G:
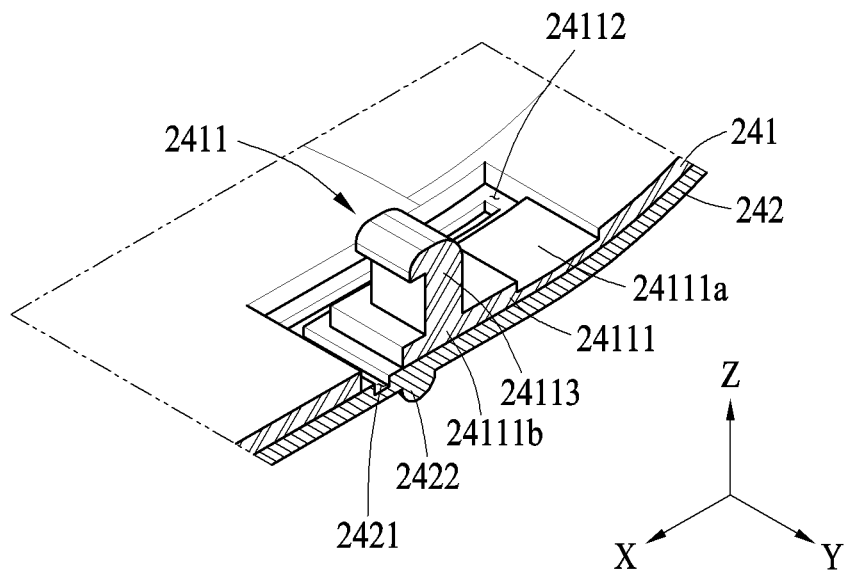
FIG. 2G is a cross-sectional perspective view taken along line B-B of FIG. 2F.

FIG. 2F is a perspective view of a first hook structure 2411 according to an example embodiment. FIG. 2G is a cross-sectional perspective view taken along line B-B of FIG. 2F.

Referring to FIGS. 2F and 2G, the first hook structure 2411 may include a cantilever 24111, a cutout 24112, and the first hook 24113.

In an example embodiment, a side of the cantilever 24111 may be provided as a free end 24111b, and the other side thereof may be provided as a fixed end 24111a. The cantilever 24111 may be provided by the cutout 24112. The cutout 24112 may be a region in which a portion of the first cover 241 is cut out to provide the cantilever 24111. That is, the cantilever 24111 may be provided by cutting out a portion (e.g., the cutout 24112) of the first cover 241 except for the fixed end 24111a. For example, the cutout 24112 may be provided in a "U" shape or an angled "U" shape. The cantilever 24111 may be provided in a direction in which the fixed end 24111a is placed relatively on an outer side of the first cover 241 than the free end 24111b. The longitudinal direction of the cantilever 24111 may be a direction substantially from an outer side of the first cover 241 toward the center of the first cover 241.

In an example embodiment, a thickness of at least a portion of the fixed end 24111a of the cantilever 24111 may be less than a thickness of the other region (e.g., a region excluding the fixed end 24111a) of the first cover 241. For example, a front surface (e.g., the +z axis direction surface) of the fixed end 24111a may be recessed in a rear direction (e.g., the −z axis direction) and create a step. However, this is an example, and the shape and/or the thickness of the fixed end 24111a are not limited thereto. For example, the thickness of the fixed end 24111a may continuously reduce.

In an example embodiment, the first hook 24113 may protrude from a front surface (e.g., the +z axis direction surface) of the cantilever 24111 toward a front direction (e.g., the +z axis direction). A head 24113a of the first hook 24113 may be substantially provided in a direction toward the center of the first cover 241. The first hook 24113 may be configured to be fastened to a first insert portion (e.g., the first insert portion 2122 of FIG. 2C) by inserting at least a portion of the first hook 24113 into the first insert portion 2122 of a second housing (e.g., the second housing 212 of FIG. 2C). The first hook 24113 may be substantially provided at the free end 24111b of the cantilever 24111 or adjacent to the free end 24111b. For example, the first hook 24113 may protrude from a front surface (e.g., the +z axis direction surface) of the free end 24111b of the cantilever 24111 toward a front direction (e.g. the +z axis direction). However, this is an example, and the first hook 24113 may be provided between the free end 24111b and the fixed end 24111a of the cantilever 24111.

In an example embodiment, a groove 2421 may be provided in a front surface (e.g., the +z axis direction surface) of the second cover 242. The groove 2421 may be provided at a location corresponding to the cutout 24112 of the first cover 241. The groove 2421 may be provided along at least a portion of the cutout 24112. For example, the groove 2421 may be provided in a "U" shape or an angled "U" shape. The groove 2421 may be recessed from the front surface (e.g., the +z axis direction surface) of the second cover 242 toward a rear direction (e.g., the −z axis direction). A thickness of a region where the groove 2421 is provided may be less than a thickness of the other region (e.g., a region where the groove 2421 is not provided) of the second cover 242.

Figure 2H:
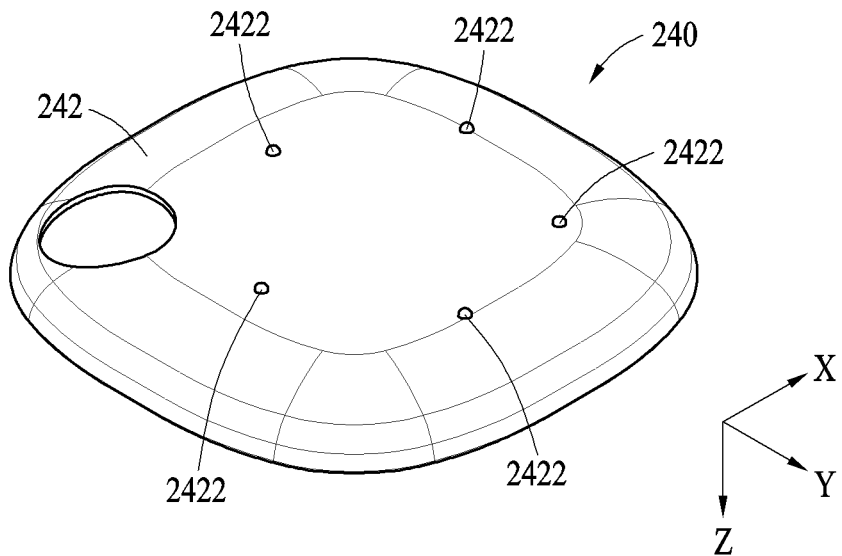
FIG. 2H is a rear perspective view of a cover according to an example embodiment.

FIG. 2H is a rear perspective view of a cover according to an example embodiment.

Referring to FIG. 2H, a guide 2422 may be provided on a rear surface (e.g., the −z axis direction surface) of the second cover 242. Based on a state in which the first cover 241 is fastened to the second cover 242, the guide 2422 may be provided at a location corresponding to a free end (e.g., the free end 24111b of FIG. 2F) of a cantilever (e.g., the cantilever 24111 of FIG. 2F). The number of guides 2422 may correspond to the number of first hook structures 2411. For example, as shown in FIG. 2H, five of the guides 2422 may be provided. However, this is an example, and the number and/or the location of the guides 2422 are not limited thereto.

In an example embodiment, the guide 2422 may be provided to be distinguishable by sight and/or tactile sensation. For example, as shown in FIG. 2H, the guide 2422 may protrude from the rear surface (e.g., the −z axis direction surface) of the second cover 242 toward the rear direction (e.g., the −z axis direction). However, this is an example, and the shape of the guide 2422 is not limited thereto. For example, the guide 2422 may be recessed from the rear surface (e.g., the −z axis direction surface) of the second cover 242 toward the front direction (e.g., the +z axis direction).

Figure 2I:
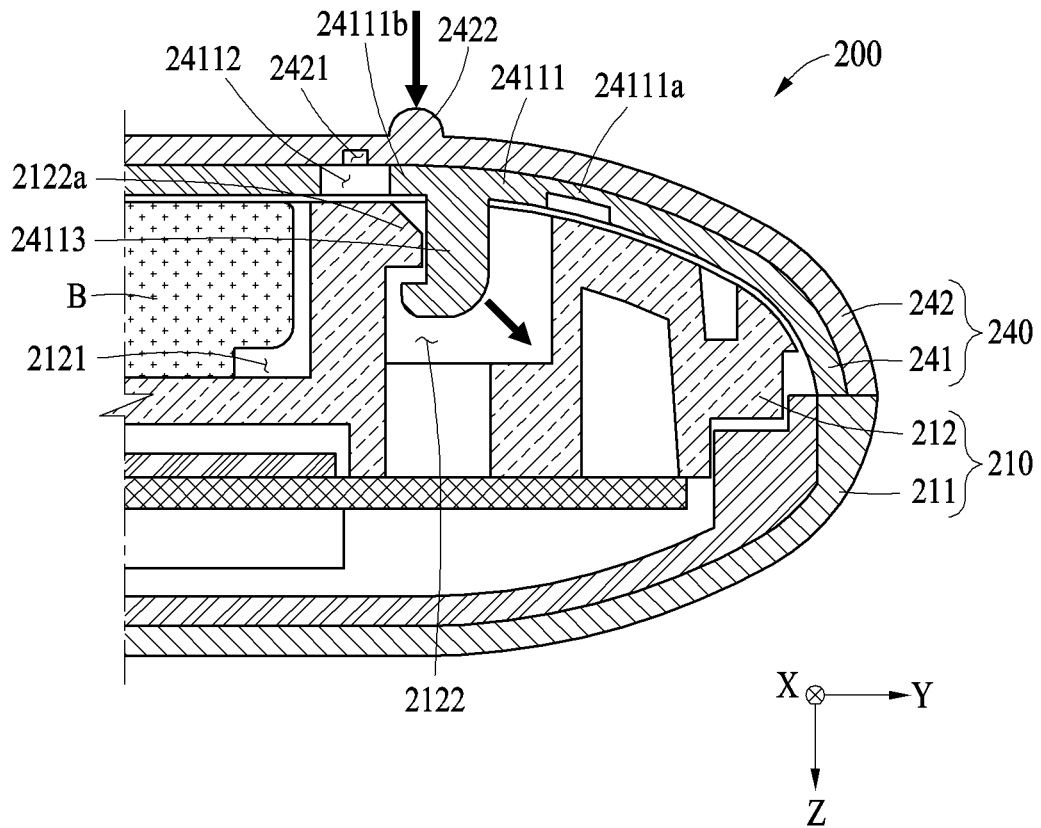
FIG. 2I is a partial cross-sectional view of an electronic device according to an example embodiment.

FIG. 2I is a partial cross-sectional view of an electronic device according to an example embodiment. Hereinafter, a process of releasing fastening between the first hook 24113 and the first insert portion 2122 is described with reference to FIG. 2I. The fastening between the first hook 24113 and the first insert portion 2122 may be relatively strongly formed, and may be configured to be released through driving described below.

In an example embodiment, a user may identify a location, to which pressure is applied for separating the cover 240, through the guide 2422 provided on the rear surface (e.g., the −z axis direction surface) of the second cover 242. That is, the guide 2422 may guide the user to a location to press to separate the cover 240. The user may apply pressure to the guide 2422 in a front direction (e.g., the +z axis direction) to separate the cover 240 from the housing 210 (e.g., the second housing 212). When the pressure applies to the guide 2422 in the front direction (e.g., the +z axis direction), the applied pressure may be delivered to the free end 24111b contacting with the guide 2422, and the free end 24111b may be pressed in the front direction (e.g., the +z axis direction). Accordingly, the cantilever 24111 may be bent to protrude toward the front direction (e.g., the +z axis direction) based on the fixed end 24111a. When the cantilever 24111 is bent, the first hook 24113 placed on the free end 24111b may be moved in the front direction (e.g., the +z axis direction) and/or an outward direction (e.g., the +y axis direction with reference to FIG. 2I). As a result, as the first hook 24113 and the hook shape 2122a of the first insert portion 2122 are spaced apart from each other, fastening between the first hook 24113 and the first insert portion 2122 may be released.

In an example embodiment, a thickness of the fixed end 24111a of the cantilever 24111 may be formed to be less than the thickness of the other region (e.g., a region excluding the fixed end 24111a) of the first cover 241 such that the cantilever 24111 may be easily bent. In addition, since the second cover 242 is formed of a material of which a hardness is less than the first cover 241 or elasticity is greater than the first cover 241, the second cover 242 may be more easily deformed than the first cover 241 when pressure is applied to the guide 2422, and thus, the pressure applied to the guide 2422 may be smoothly delivered to the free end 24111b of the cantilever 24111. In addition, since a thickness of a region corresponding to the cutout 24112 of the second cover 242 is formed to be less than a thickness of the other region (e.g., a region where the groove 2421 is not provided) due to the groove 2421 provided in the second cover 242, a degree of deformation of a region adjacent to the guide 2422 may increase when pressure is applied to the guide 2422, and thus, the pressure applied to the guide 2422 may be smoothly delivered to the free end 24111b of the cantilever 24111.

As described with reference to FIGS. 2A to 2I, the cover 240 of the electronic device 200 may be fastened to or released from the housing 210 through the first hook structure 2411 and the second hook 2412. To separate the cover 240 from the housing 210, the user may separate the second hook 2412 from the second insert portion 2123 by applying constant force to an outer part of the cover 240, and may separate the first hook 24113 from the first insert portion 2122 by applying constant force to the guide 2422. For example, fastening force between the second hook 2412 and the second insert portion 2123 may be less than fastening force between the first hook 24113 and the first insert portion 2122. For example, the user may firstly separate the second hook 2412 from the second insert portion 2123, and secondly separate the first hook 24113 from the first insert portion 2122. According to the double fastening structure as described above, the fastening force between the second hook 2412 and the second insert portion 2123 placed on an outer part of the electronic device 200 may be relatively weakly formed, compared to a single fastening structure (e.g., a structure in which a hook is placed only on an outer part of an electronic device). Accordingly, since the user does not need to apply excessive force to remove the cover 240, an exterior of the electronic device 200 may be prevented from being damaged while the user removes the cover 240. In addition, since the first hook 24113 and the first insert portion 2122 are placed on relatively inside compared to the second hook 2412 and the second insert portion 2123, fastening between the first hook 24113 and the first insert portion 2122 may be relatively protected from external impact. For example, even in case fastening between the second hook 2412 and the second insert portion 2123 is released due to external impact, the fastening between the first hook 24113 and the first insert portion 2122 may be maintained without being released. Accordingly, unintentional separation of the cover 240 from the housing 210 due to the external impact may be prevented. In addition, since the first hook 24113 and the first insert portion 2122 are placed adjacent to the battery disposition space 2121, even in case the fastening between the second hook 2412 and the second insert portion 2123 is released due to the external impact, the battery disposition space 2121 may be stably covered by the cover 240 through the fastening between the first hook 24113 and the first insert portion 2122, and thus, contact between the battery B and a terminal may be stably maintained. In addition, since the second cover 242, which is an outer part of the cover 240, is formed of a material having a low hardness or high elasticity, the second cover 242 may absorb the external impact, and thus, the electronic device 200 may be protected from the external impact.

In an example embodiment, in the electronic device 200, when the user desires to separate the cover 240, the cover 240 may be easily separated from the housing 210 by indicating to the user a location where to apply pressure through the guide 2422. In addition, by the double fastening structure between the cover 240 and the housing 210, unintentional separation of the cover 240 may be prevented due to a typical operation by the user or external impact, and thus, the stability of the electronic device 200 may be secured by maintaining the fastening force of the cover 240 in a typical use state. In addition, since an extra configuration, such as a screw, is not required, the implementation of the electronic device 200 may be improved and the size of the electronic device 200 may be reduced by reducing the number of components.

Figure 2J:
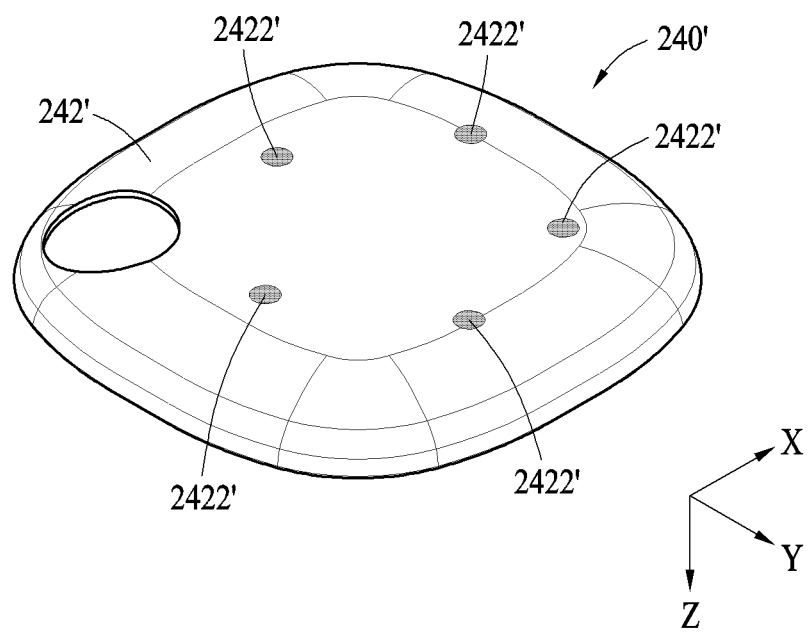
FIG. 2J is a rear perspective view of a cover according to another embodiment.

FIG. 2J is a rear perspective view of a cover according to another embodiment.

Referring to FIG. 2J, a guide 2422' of a cover 240' may be formed to have a roughness different from a region of a rear surface (e.g., the −z axis direction surface) of a second cover 242'. For example, the guide 2422' may have a different roughness from the other region of the second cover 242' (e.g., a region where the guide 2422' is not provided) through an etching process or a corrosion process. In an example embodiment, the guide 2422' of the cover 240' may be formed to have a different color and/or a pattern on a region of the rear surface (e.g., the −z axis direction surface) of the second cover 242', compared to the other region of the second cover 242' (e.g. a portion in which the guide 2422' is not provided). However, this is an example, and the shape and/or the type of the guide 2422' are not limited thereto.

Figure 3A:
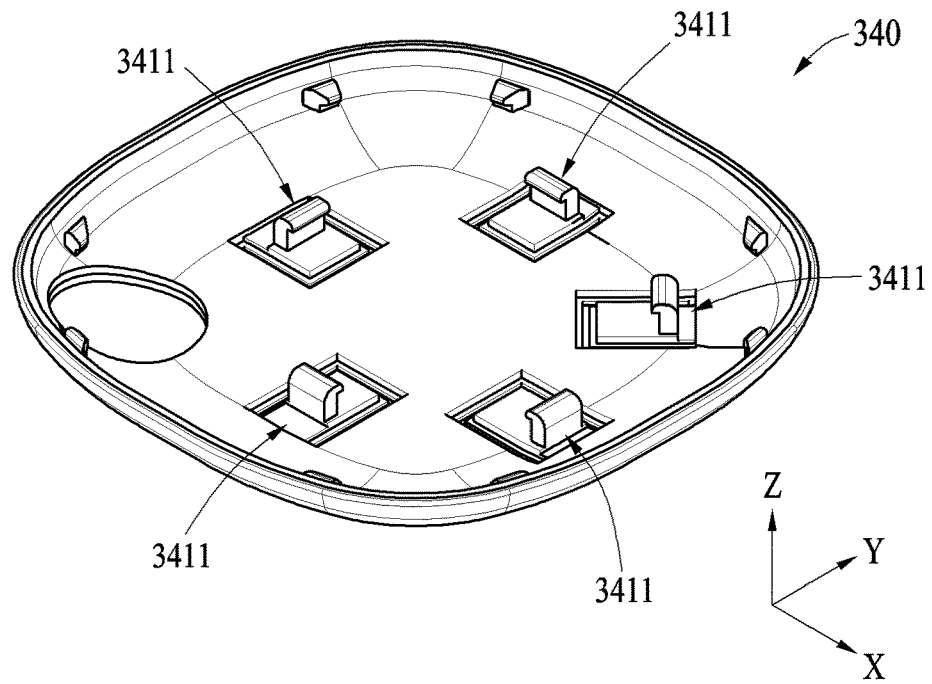
FIG. 3A is a perspective view of a cover according to an example embodiment.
Figure 3B:
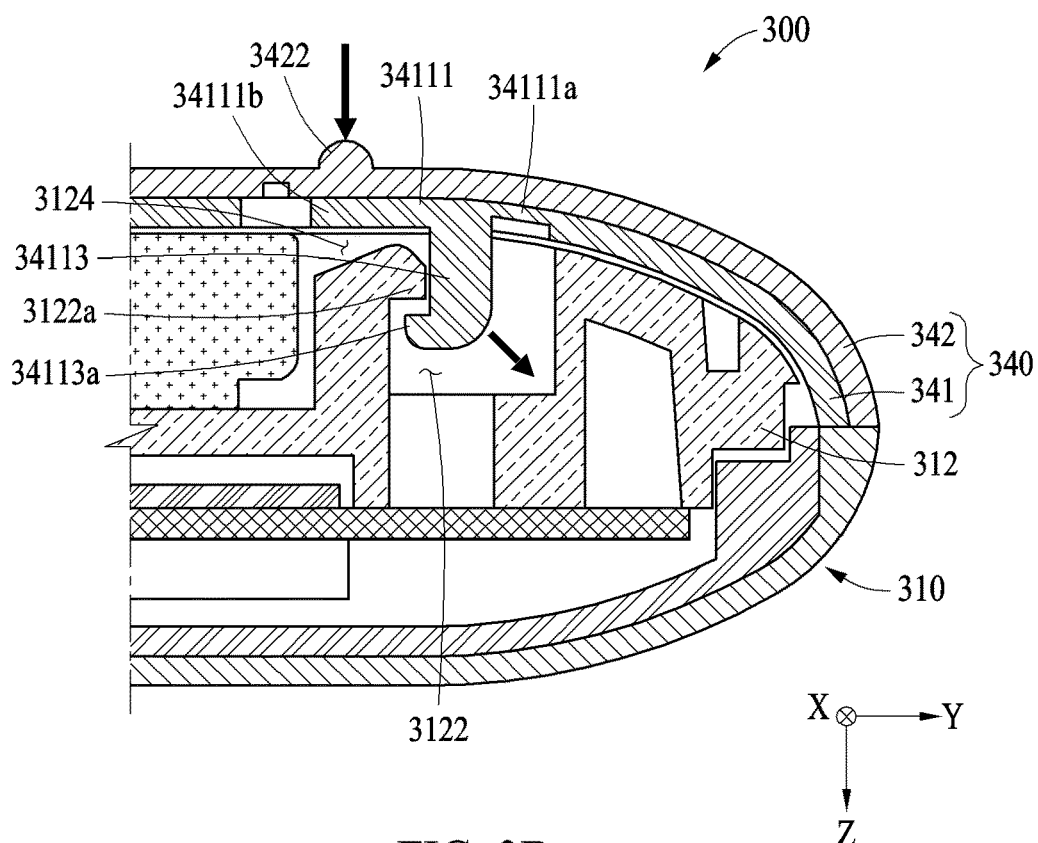
FIG. 3B is a partial cross-sectional view of an electronic device according to an example embodiment.

FIG. 3A is a perspective view of a cover according to an example embodiment. FIG. 3B is a partial cross-sectional view of an electronic device according to an example embodiment.

To describe an electronic device 300 with reference to FIGS. 3A and 3B, a detailed description of a configuration, which is substantially same as the electronic device 200 with reference to FIGS. 2A to 2I, is omitted.

Referring to FIGS. 3A and 3B, a first hook 34113 may be substantially provided at a fixed end 34111a of a cantilever 34111 or adjacent to the fixed end 34111a. For example, the first hook 34113 may protrude from a front surface (e.g., the +z axis direction surface) of the fixed end 34111a of the cantilever 34111 toward a front direction (e.g., the +z axis direction). A head 34113a of the first hook 34113 may be substantially provided in a direction toward the center of a first cover 341.

In an example embodiment, a thickness of at least a portion of the fixed end 34111a of the cantilever 34111 may be less than a thickness of the other region (e.g., a region excluding the fixed end 34111a of the cantilever 34111) of the first cover 341. For example, the front surface (e.g., the +z axis direction surface) of the fixed end 34111a may be recessed in a rear direction (e.g., the −z axis direction) and create a step. A location where the thickness of the fixed end 34111a reduces may be relatively outside, compared to a location where the first hook 34113 is provided based on the center of a first cover 341. However, this is an example, and the shape and/or the thickness of the fixed end 34111a are not limited thereto. For example, the thickness of the fixed end 34111a may continuously reduce or taper along the z-axis, for example.

In an example embodiment, the user may apply pressure to a guide 3422 in the front direction (e.g. the +z axis direction) to separate a cover 340 from a housing 310 (e.g., a second housing 312). When the pressure is applied to the guide 3422 in the front direction (e.g., the +z axis direction), the applied pressure may be delivered to a free end 34111b contacting with the guide 3422, and the free end 34111b may be pressed toward the front direction (e.g., the +z axis direction). Accordingly, the cantilever 34111 may be bent to protrude toward the front direction (e.g., the +z axis direction) based on the fixed end 34111a. When the cantilever 34111 is bent, the first hook 34113 placed on the fixed end 34111a may be moved in the front direction (e.g., the +z axis direction) and/or an outward direction (e.g., the +y axis direction with reference to FIG. 3B). As a result, as the first hook 34113 and a hook shape 3122a of a first insert portion 3122 are spaced apart from each other, fastening between the first hook 34113 and the first insert portion 3122 may be released. For example, the example embodiments according to FIGS. 3A and 3B may be applied to a case in which there is a difficulty in providing the first hook 34113 at the free end 34113b due to interference with other components. While the cantilever 34111 is bent, a groove 3124 may be formed to provide a space, in which the cantilever 34111 may be bent, at a location corresponding to the free end 34111b in the second housing 312 such that the free end 34111b of the cantilever 34111 may be not interfered by the second housing 312.

Figure 4A:
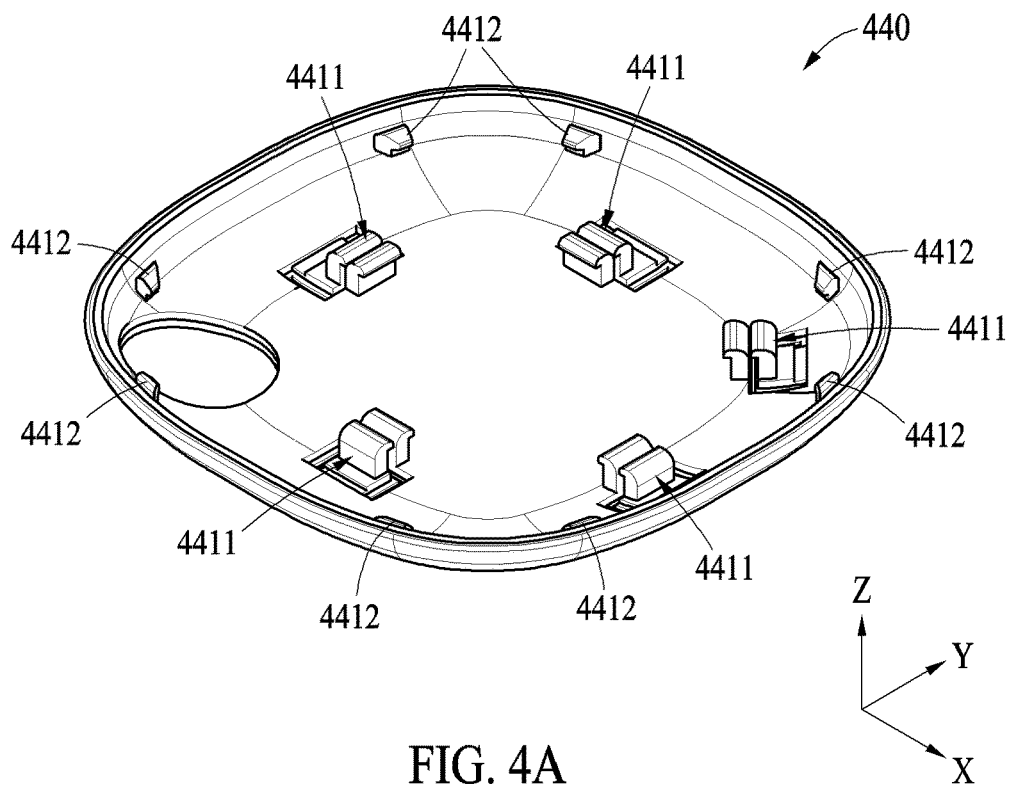
FIG. 4A is a perspective view of a cover according to an example embodiment.
Figure 4B:
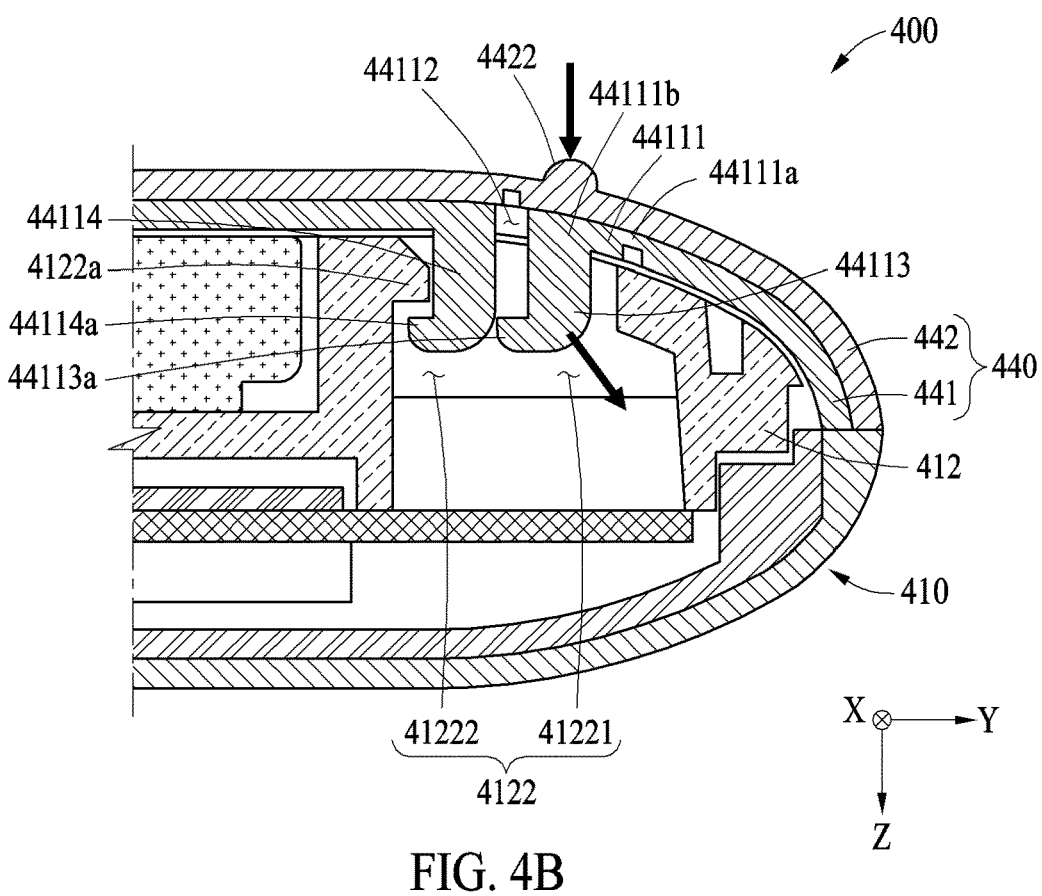
FIG. 4B is a partial cross-sectional view of an electronic device according to an example embodiment.

FIG. 4A is a perspective view of a cover according to an example embodiment. FIG. 4B is a partial cross-sectional view of an electronic device according to an example embodiment.

To describe an electronic device 400 with reference to FIGS. 4A and 4B, a detailed description of a configuration, which is substantially same as the electronic device 200 with reference to FIGS. 2A to 2I, is omitted.

Referring to FIGS. 4A and 4B, a first cover 441 may include a first hook structure 4411 and a second hook 4412. A second housing 412 may include a first insert portion 4122 and a second insert portion (not shown) (e.g., the second insert portion 2123 of FIG. 2C).

In an example embodiment, the first hook structure 4411 may include a cantilever 44111, a cutout 44112, a first hook 44113, and a third hook 44114. The cantilever 44111, the cutout 44112, and the first hook 44113 are substantially the same as the descriptions with reference to FIGS. 2F and 2G, and thus, only the following description is provided to avoid repeated description.

In an example embodiment, the third hook 44114 may be provided at a location adjacent to the first hook 44113. The cutout 44112 may be placed between the third hook 44114 and the first hook 44113. The third hook 44114 may be placed closer to the center of the first cover 441, compared to the first hook 44113. For example, the cutout 44112 may be placed between the third hook 44114 and the first hook 44113, and the third hook 44114 may be placed on a line extending in a longitudinal direction of the cantilever 44111 to be adjacent to the first hook 44113. The third hook 44114 may protrude from a front surface (e.g., the +z axis direction surface) of the first cover 441 toward a front direction (e.g., the +z axis direction). A head 44114*a* of the third hook 44114 may be provided in a substantially same direction as a head 44113*a* of the first hook 44113. For example, the head 44114*a* of the third hook 44114 may be provided in a direction substantially toward the center of the first cover 441. The number of third hooks 44114 may correspond to the number of first hooks 44113.

In an example embodiment, the first insert portion 4122 may provide a space in which at least a portion of the first hook structure 4411 inserts. For example, the first hook 44113 and the third hook 44114 may be inserted into the first insert portion 4122. The first insert portion 4122 may be provided in a shape to be fastened to the third hook 44114. For example, the first insert portion 4122 may be provided in a corresponding hook shape 4122*a* to be fastened to the third hook 44114.

In an example embodiment, the first insert portion 4122 may include a first insert space 41221 and a second insert space 41222. The first insert space 41221 may be a space in which the first hook 44113 inserts. The second insert space 41222 may be a space in which the third hook 44114 inserts. The second insert space 41222 may be provided in a shape to be fastened to the third hook 44114. For example, the second insert space 41222 may be provided in a corresponding hook shape 4122*a* to be fastened to the third hook 44114. As the third hook 44114 inserts into the second insert space 41222, the first insert portion 4122 and the third hook 44114 may be fastened to each other.

In an example embodiment, based on a state in which a cover 440 is fastened to the second housing 412, the first insert space 41221 may be provided at a location corresponding to the first hook structure 4411, and the second insert space 41222 may be provided at a location corresponding to the third hook 44114. The second insert space 41222 may be provided adjacent to the first insert space 41221. The second insert space 41222 may be placed closer to the center of the second housing 412, compared to the first insert space 41221.

Referring to FIG. 4B, in a state in which the cover 440 is fastened to a housing 410 (e.g., the second housing 412), since the first hook 44113 and the third hook 44114 are placed adjacent to each other, the first hook 44113 may support the third hook 44114 from an outer side (e.g., the +y axis direction with reference to FIG. 4B) such that the first hook 44113 may limit driving of the third hook 44114. For example, since the head 44113*a* of the first hook 44113 is placed adjacent to the third hook 44114 from the outer side (e.g., the +y axis direction with reference to FIG. 4B) of the third hook 44114, movement in an outward direction (e.g., the +y axis direction with reference to FIG. 4B) by the third hook 44114 may be limited. Accordingly, fastening between the third hook 44114 and the first insert portion 4122 may be prevented from being released in a state in which the first hook 44113 supports the third hook 44114 from the outer side (e.g., the +y axis direction with reference to FIG. 4B) of the third hook 44114.

In an example embodiment, the user may apply pressure to a guide 4422 in the front direction (e.g. the +z axis direction) to separate a cover 440 from a housing 410 (e.g., a second housing 412). When the pressure is applied to the guide 4422 in the front direction (e.g., the +z axis direction), the applied pressure may be delivered to a free end 44111*b* contacting with the guide 4422, and the free end 44111*b* may be pressed toward the front direction (e.g., the +z axis direction). Accordingly, the cantilever 44111 may be bent to protrude toward the front direction (e.g., the +z axis direction) based on a fixed end 44111*a*. When the cantilever 44111 is bent, the first hook 44113 placed on the free end 44111*b* may be moved in the front direction (e.g., the +z axis direction) and/or an outward direction (e.g., the +y axis direction with reference to FIG. 4B). As the first hook 44113 is moved in the front direction (e.g., the +z axis direction) and/or the outward direction (e.g., the +y axis direction with reference to FIG. 4B), the first hook 44113 and the third hook 44114 may be spaced apart from each other, and thus, a driving space for the third hook 44114 in the first insert portion 4122 may be secured. That is, as a space in which the third hook 44114 may move in the outward direction (e.g., the +y axis direction with reference to FIG. 4B) is secured, the fastening between the third hook 44114 and the first insert portion 4122 may be released. In the state describe above, in case constant force is applied to the third hook 44114, the third hook 44114 may be separated from the first insert portion 4122. The fastening force between the third hook 44114 and the first insert portion 4122 may be relatively weakly formed. According to the structure described above, the user may move the first hook 44113, which supports the third hook 44114, to the outer side (e.g., the +y axis direction with reference to FIG. 4B) by pressing the guide 4422, and then, may separate the third hook 44114 from the first insert portion 4122 by applying the constant force. In example embodiments according to FIGS. 4A and 4B, the fastening force between the cover 440 and the housing 410 may be strengthened through a triple fastening structure.

Meanwhile, in example embodiments described with reference to FIGS. 2A to 2I, FIGS. 3A and 3B, and FIGS. 4A and 4B, drawings and descriptions are provided that the free ends 24111*b*, 34111*b*, and 44111*b* of the cantilevers 24111, 34111, and 44111 are provided closer to the center of the second covers 242, 342, and 442, compared to the fixed ends 24111*a*, 34111*a*, and 44111*a*, however, these are examples, and the directions of the cantilevers 24111, 34111, and 44111 are not limited thereto. For example, the free ends 24111*b*, 34111*b*, and 44111*b* of the cantilevers 24111, 34111, and 44111 may be provided closer to an outer side of the second covers 242, 342, and 442, compared to the fixed ends 24111*a*, 34111*a*, and 44111*a*, and in this case, the heads 24113*a*, 34113*a*, and 44113*a* of the first hooks 24113, 34113, and 44113 and/or the head 44114*a* of the third hook 44114 may be provided in a direction toward the outer side of the second covers 242, 342, and 442.

According to certain embodiments, the electronic device 200 may include the first housing 211 facing the first direction; the second housing 212 fastened to the first housing 211 to face the second direction opposite to the first direction and including the battery disposition space 2121 open toward the second direction and the plurality of first insert portions 2122 on the periphery of the battery disposition space while being spaced apart from each other along the circumference of the battery disposition space 2121; and the cover 240 fastened to the second housing 212 to cover the battery disposition space 2121, and the cover 240 may include the first cover 241 formed of the first material; and the second cover 242 formed of the second material and coupled to the first cover 241 from the second direction, and the first cover 241 may include the plurality of first hook structures 2411 provided at the location corresponding to the plurality of first insert portions 2122 and configured to fasten the second housing 212 to the cover 240 by being inserted into the plurality of first insert portions 2122.

According to certain embodiments, each of the first hook structure 2411 may include a cantilever 24111 including the free end 24111b at one side and the fixed end 24111a at another side; the cutout 24112 cutting out a portion of the first cover 241 to provide the cantilever 24111; and the first hook 24113 protruding from the cantilever 24111 toward the first direction.

According to certain embodiments, the first hook 24113 may be provided at the free end 24111b of the cantilever 24111.

According to certain embodiments, the first hook 34113 may be provided at the fixed end 34111a of the cantilever 34111.

According to certain embodiments, the thickness of the fixed end 24111a of the cantilever 24111 may be less than a thickness of another region of the first cover 241.

According to certain embodiments, on the surface, which faces the second direction, of the second cover 242, the guide 2422 may be provided at a location corresponding to the free end 24111b.

According to certain embodiments, when the guide 2422 is urged toward the first direction, fastening between the first hook 24113 and the first insert portion 2122 may be released as the cantilever 24111 is bent to protrude toward the first direction based on the fixed end 24111a.

According to certain embodiments, the guide may be distinguishable by sight or tactile sensation.

According to certain embodiments, on the surface, which faces the first direction, of the second cover 242, the groove 2421 recessed along a portion of the cutout 24112 may be provided at the location corresponding to the cutout 24112.

According to certain embodiments, the second housing 212 may further include the plurality of second insert portions 2123 on the outer part of the second housing 212 while being spaced apart from each other along the circumference of the second housing 212, and the first cover 241 may further include the plurality of second hooks 2412 provided at the location corresponding to the plurality of second insert portions 2123, and configured to fasten the second housing 212 to the cover 240 by being inserted into the plurality of second insert portions 2123.

According to certain embodiments, at least a portion of the plurality of first hook structures 2411 and at least a portion of the plurality of second hooks 2412 may be alternately disposed along the circumferential direction of the first cover 241 based on a center of the first cover 241.

According to certain embodiments, each of the plurality of the first hook structures 4411 may further include the third hook 44114 protruding from the location adjacent to the first hook 44113 toward the first direction such that the cutout 44112 is placed between the first hook 44113 and the third hook 44114, and the first hook 44113 and the third hook 44114 are inserted into the first insert portion 4122 of the second housing 412, and the first insert portion 4122 is configured to be fastened to the third hook 44114.

According to certain embodiments, in case the free end 44111b of the cantilever 44111 is pressed toward the first direction, the first hook 44113 may be spaced apart from the third hook 44114 as the cantilever 44111 is bent to protrude toward the first direction based on the fixed end 44111a, and fastening between the third hook 44114 and the first insert portion 4122 may be released by securing a driving space for the third hook 44114.

According to certain embodiments, a hardness of the second material may be less than a hardness of the first material.

According to certain embodiments, the first cover 241 and the second cover 242 may be integrally formed through a double injection process.

According to certain embodiments, the electronic device 200 may include the housing 210 including the battery disposition space 2121 open toward the rear side and the plurality first insert portions 2122 on the periphery of the battery disposition space 2121 while being spaced apart from each other along the circumference of the battery disposition space 2121; and the cover 240 fastened to the rear side of housing 210 to cover the battery disposition space 2121, and the cover 240 may include the first cover 241 formed of the first material; and the second cover 242 formed of the second material and coupled to the rear side of the first cover 241, and the first cover 241 may include the plurality of first hook structures 2411 provided at the location corresponding to the plurality of first insert portions 2122 and configured to fasten the housing 210 to the cover 240 by being inserted into the plurality of first insert portions 2122.

According to certain embodiments, each of the first hook structures 2411 may include the cantilever 24111 including the free end 24111b at one side and the fixed end 24111a at another side; the cutout 24112 cutting out a portion of the first cover 241 to provide the cantilever 24111; and the first hook 24113 protruding from the cantilever 24111 toward the front direction.

According to certain embodiments, on the rear surface of the second cover 242, the guide 2422 may be provided at the location corresponding to the free end 24111b.

According to certain embodiments, in case the guide 2422 is pressed toward the front direction, fastening between the first hook 24113 and the first insert portion 2122 may be released as the cantilever 24111 is bent to protrude toward the front direction based on the fixed end 24111a.

According to certain embodiments, the electronic device 200 may include the first housing 211 facing the first direction; the second housing 212 fastened to the first housing 211 to face the second direction opposite to the first direction and including the battery disposition space 2121 open toward the second direction; and the cover 240 fastened to the second housing 212 to cover the battery disposition space 2121, and the second housing 2121 may further include the plurality of first insert portions 2122 on the periphery of the battery disposition space 2121 while being spaced apart from each other along the circumference of the battery disposition space 2121; and the plurality of second insert portions 2123 on the outer part of the second housing 212 while being spaced apart from each other along the circumference of the second housing 212, and the cover 240 may include the first cover 241 formed of the first material; and the second cover 242 formed of the second material that has a lesser hardness than the first material, and coupled to the first cover 241 from the second direction, the first cover 241 may include the plurality of first hook structures 2411 provided at the location corresponding to the plurality of first insert portions 2122 and configured to fasten the second housing 212 to the cover 240 by being inserted into the plurality of first insert portions 2122; and the plurality of second hooks 2412 provided at the location corresponding to the plurality of second insert portions 2123, and configured to fasten the second housing 212 to the cover 240 by being inserted into the plurality of second insert portions 2123, and the first hook structure 2411 may include a cantilever 24111 including the free end 24111b at one side and the fixed end 24111a at another side; the cutout 24112 cutting out a portion of the first cover 241 to provide the cantilever 24111; and the first hook 24113 protruding from the cantilever 24111 toward the first direction, and urging the free end 24111b of the cantilever 24111 toward the first direction causes fastening between the first hook 24113 and the first insert portion 2122 may be released as the cantilever 24111 is bent to protrude toward the first direction based on the fixed end 24111a.

What is claimed is:

1. An electronic device comprising:
 a first housing facing a first direction;
 a second housing fastened to the first housing to face a second direction opposite to the first direction and comprising a battery disposition space open toward the second direction and a plurality of first insert portions that are apart from each other on a periphery of the battery disposition space along a circumference of the battery disposition space; and
 a cover fastened to the second housing, the cover covering the battery disposition space, the cover comprising:
  a first cover comprising a first material; and
  a second cover comprising a second material and coupled to the first cover from the second direction, the first cover comprising a plurality of first hook structures provided at locations corresponding to the plurality of first insert portions, the plurality of first hook structures fastening the second housing to the cover when the plurality of first hook structures are inserted into the plurality of first insert portions.

2. The electronic device of claim 1, wherein each of the first hook structures comprises:
 a cantilever comprising a free end at one side and a fixed end at another side;
 a cutout cutting out a portion of the first cover to provide the cantilever; and
 a first hook protruding from the cantilever toward the first direction.

3. The electronic device of claim 2, wherein the first hook is provided at the free end of the cantilever.

4. The electronic device of claim 2, wherein the first hook is provided at the fixed end of the cantilever.

5. The electronic device of claim 2, wherein a thickness of the fixed end of the cantilever is less than a thickness of another region of the first cover.

6. The electronic device of claim 2, wherein, on a surface, which faces the second direction, of the second cover, a guide is provided at a location corresponding to the free end.

7. The electronic device of claim 6, wherein, in case the guide is pressed toward the first direction, fastening between the first hook and the first insert portion is released as the cantilever is bent to protrude toward the first direction based on the fixed end.

8. The electronic device of claim 6, wherein the guide has at least one of a tactile indicia and visual indicia.

9. The electronic device of claim 2, wherein on a surface, which faces the first direction, of the second cover, a groove recessed along a portion of the cutout is provided at a location corresponding to the cutout.

10. The electronic device of claim 2, wherein:
 the second housing further comprises a plurality of second insert portions that are apart from each other on an outer part of the second housing along a circumference of the second housing; and
 the first cover further comprises a plurality of second hooks provided at locations corresponding to the plurality of second insert portions, the plurality of second hook structures fastening the second housing to the cover when the plurality of second hook structures are inserted into the plurality of second insert portions.

11. The electronic device of claim 10, wherein at least a portion of the plurality of first hook structures and at least a portion of the plurality of second hooks are alternately disposed in a circumferential direction of the first cover based on a center of the first cover.

12. The electronic device of claim 3, wherein:
 each of the plurality of first hook structures further comprises a third hook protruding from a location adjacent to the first hook toward the first direction such that the cutout is placed between the first hook and the third hook; and
 the first hook and the third hook are inserted into the first insert portion of the second housing to detachably fasten the first insert portion and the third hook.

13. The electronic device of claim 12, wherein urging the free end of the cantilever toward the first direction causes the first hook is spaced apart from the third hook as the cantilever is bent to protrude toward the first direction based on the fixed end, and fastening between the third hook and the first insert portion is releasable by securing a driving space for the third hook.

14. The electronic device of claim 1, wherein a hardness of the second material is less than a hardness of the first material.

15. The electronic device of claim 1, wherein the first cover and the second cover are integrally formed through a double injection process.

16. An electronic device comprising:
 a housing comprising a battery disposition space open toward a rear side and a plurality of first insert portions that are apart from each other on a periphery of the battery disposition space along a circumference of the battery disposition space; and
 a cover fastened to a rear side of the housing to cover the battery disposition space,
 wherein the cover comprises:
 a first cover formed of a first material; and
 a second cover formed of a second material and coupled to a rear side of the first cover, and
 the first cover comprises a plurality of first hook structures provided at locations corresponding to the plurality of first insert portions, to the first cover fastening the housing to the cover when inserted into the plurality of first insert portions.

17. The electronic device of claim 16, wherein each of the first hook structures comprises:
 a cantilever comprising a free end at one side and a fixed end at another side;
 a cutout cutting out a portion of the first cover to provide the cantilever; and a first hook protruding from the cantilever toward a front direction.

18. The electronic device of claim 17, wherein, on a rear surface of the second cover, a guide is provided at a location corresponding to the free end.

19. The electronic device of claim 18, wherein, in case the guide is pressed toward the front direction, fastening between the first hook and the first insert portion is released as the cantilever is bent to protrude toward the front direction based on the fixed end.

20. An electronic device comprising:
a first housing facing a first direction;
a second housing fastened to the first housing to face a second direction opposite to the first direction and comprising a battery disposition space open toward the second direction; and
a cover fastened to the second housing to cover the battery disposition space,
wherein the second housing comprises:
a plurality of first insert portions that are apart from each other on a periphery of the battery disposition space along a circumference of the battery disposition space; and
a plurality of second insert portions that are apart from each other on an outer part of the second housing along a circumference of the second housing, the cover comprising:
a first cover comprising a first material; and
a second cover comprising a second material that has a lesser hardness than the first material, and coupled to the first cover from the second direction, the first cover comprising:
a plurality of first hook structures provided at locations corresponding to the plurality of first insert portions, and configured to fasten the second housing to the cover by being inserted into the plurality of first insert portions; and
a plurality of second hooks provided at locations corresponding to the plurality of second insert portions, and configured to fasten the second housing to the cover by being inserted into the plurality of second insert portions, each of the first hook structures comprising:
a cantilever comprising a free end at one side and a fixed end at another side;
a cutout cutting out a portion of the first cover to provide the cantilever; and
a first hook protruding to the first direction from the cantilever, and
wherein urging the free end of the cantilever toward the first direction causes fastening between the first hook and the first insert portion to be released as the cantilever is bent to protrude toward the first direction based on the fixed end.

* * * * *